(12) United States Patent
Strong et al.

(10) Patent No.: US 10,754,371 B1
(45) Date of Patent: Aug. 25, 2020

(54) CAPACITIVE CLOCK DISTRIBUTION SYSTEM

(71) Applicants: Joshua A. Strong, Ellicott City, MD (US); Jose M. Acevdeo, Ellicott City, MD (US); Alexander K. Sirota, Columbia, MD (US); Max E. Nielsen, Odenton, MD (US)

(72) Inventors: Joshua A. Strong, Ellicott City, MD (US); Jose M. Acevdeo, Ellicott City, MD (US); Alexander K. Sirota, Columbia, MD (US); Max E. Nielsen, Odenton, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/682,860

(22) Filed: Nov. 13, 2019

(51) Int. Cl.
| | |
|---|---|
| *G06F 1/10* | (2006.01) |
| *H03K 5/15* | (2006.01) |
| *H04L 7/00* | (2006.01) |
| *H01P 7/08* | (2006.01) |
| *G06F 1/04* | (2006.01) |

(52) U.S. Cl.
CPC ................. *G06F 1/10* (2013.01); *G06F 1/04* (2013.01); *H01P 7/082* (2013.01); *H03K 5/15013* (2013.01); *H04L 7/0008* (2013.01)

(58) Field of Classification Search
CPC .......... G06F 1/10; G06F 1/04; G06F 13/4243; G06F 1/06; G06F 1/08; H01L 2924/00; H01L 39/223; H01L 2225/06541; H03K 3/38; H03K 19/195; H01P 7/082; H01P 7/00; H01P 7/08; G06N 10/00; H04L 7/0008
See application file for complete search history.

(56) References Cited

U.S. PATENT DOCUMENTS

| | | | |
|---|---|---|---|
| 3,619,504 A | 11/1971 | De Veer et al. | |
| 5,365,205 A | 11/1994 | Wong | |
| 5,432,486 A | 7/1995 | Wong | |

(Continued)

FOREIGN PATENT DOCUMENTS

| | | |
|---|---|---|
| JP | H0854957 A | 2/1996 |
| WO | 20160209387 A1 | 12/2016 |

OTHER PUBLICATIONS

Korean Office Action for Application No. 10-2017-7037126 dated Dec. 23, 2019.

(Continued)

*Primary Examiner* — Vibol Tan
(74) *Attorney, Agent, or Firm* — Tarolli, Sundheim, Covell & Tummino LLP

(57) ABSTRACT

One embodiment includes a clock distribution system. The system includes at least one resonator spine that propagates a sinusoidal clock signal and at least one resonator rib conductively coupled to the at least one resonator spine and arranged as a standing wave resonator. The system further includes at least one coupling capacitor. Each of the at least one coupling capacitor can interconnect at least one of the at least one resonator rib and a respective circuit to capacitively provide a clock current corresponding to the sinusoidal clock signal to the respective circuit to provide functions for the respective circuit.

20 Claims, 3 Drawing Sheets

(56) References Cited

U.S. PATENT DOCUMENTS

| | | | |
|---|---|---|---|
| 5,638,402 A | 6/1997 | Osaka et al. | |
| 5,990,721 A | 11/1999 | Mellitz | |
| 6,098,176 A | 8/2000 | Coteus et al. | |
| 6,184,736 B1 | 2/2001 | Wissell et al. | |
| 6,229,861 B1* | 5/2001 | Young | G06F 1/10 375/356 |
| 6,563,357 B1 | 5/2003 | Hsu et al. | |
| 6,563,358 B1 | 5/2003 | Goulette | |
| 6,978,328 B1 | 12/2005 | Osaka et al. | |
| 7,145,408 B2* | 12/2006 | Shepard | G06F 1/10 331/117 D |
| 7,880,551 B2 | 2/2011 | Chan et al. | |
| 8,525,569 B2* | 9/2013 | Bucelot | G06F 1/10 257/777 |
| 9,509,490 B1* | 11/2016 | Dabral | G06F 1/04 |
| 9,634,654 B2 | 4/2017 | Bucelot et al. | |
| 9,722,589 B1* | 8/2017 | Talanov | H03K 5/15013 |
| 9,939,841 B1* | 4/2018 | Dusatko | G06F 1/10 |
| 10,133,299 B1* | 11/2018 | Strong | G06F 1/10 |
| 10,331,163 B1* | 6/2019 | Luo | H03K 3/38 |
| 10,431,867 B1* | 10/2019 | Strong | H01L 23/66 |
| 10,474,183 B2* | 11/2019 | Strong | G06F 1/10 |
| 10,520,974 B2* | 12/2019 | Strong | G06F 1/04 |
| 10,591,952 B1 | 3/2020 | Strong et al. | |
| 2005/0057286 A1 | 3/2005 | Shepard et al. | |
| 2007/0285179 A1 | 12/2007 | Ikeda et al. | |
| 2009/0146748 A1 | 6/2009 | Pernia et al. | |
| 2014/0210518 A1 | 7/2014 | Chang et al. | |
| 2016/0125309 A1* | 5/2016 | Naaman | H01P 7/00 |
| 2016/0370822 A1* | 12/2016 | Strong | G06F 1/10 |
| 2019/0278321 A1 | 9/2019 | Strong et al. | |

OTHER PUBLICATIONS

V.L. Chi, "Salphasic Distribution of Clock Signals for Synchronous Systems", IEEE Transactions on Computers, IEEE Service Center, vol. 43, No. 5, May 1, 1994.

Sasaki, A High-Frequency Clock Distribution Network Using Inductively Loaded Standing-Wave Oscillators (Year: 2009).

International Search Report for International Application No. PCT/US2020/017701 dated May 28, 2020.

* cited by examiner

CAPACITIVE CLOCK DISTRIBUTION SYSTEM

TECHNICAL FIELD

The present invention relates generally to computer systems, and specifically to a capacitive clock distribution system.

BACKGROUND

Typical circuits that implement logic functions can operate based on a clock to synchronize data and/or provide a time-based flow of the logic functions. Circuits that are based on complementary metal-oxide-semiconductor (CMOS) technology can implement a clock to indicate when a given logic circuit or gate is to capture data at one or more inputs for processing or transferring the data to other logic functions. A given clock can thus provide a clock signal to a variety of devices in the circuit to provide the requisite timing information, and thus to substantially synchronize data transfer and timing functions. Other types of circuits can implement clock signals, such as reciprocal quantum logic (RQL) circuits. RQL circuits can implement timing information based on a clock that is provided, for example, as a sinusoidal signal having a substantially stable-frequency.

SUMMARY

One embodiment includes a clock distribution system. The system includes at least one resonator spine that propagates a sinusoidal clock signal and at least one resonator rib conductively coupled to the at least one resonator spine and arranged as a standing wave resonator. The system further includes at least one coupling capacitor. Each of the at least one coupling capacitor can interconnect at least one of the at least one resonator rib and a respective circuit to capacitively provide a clock current corresponding to the sinusoidal clock signal to the respective circuit to provide functions for the respective circuit.

Another embodiment includes a clock distribution system. The system includes at least one resonator spine that propagates a sinusoidal clock signal and at least one resonator rib conductively coupled to the at least one resonator spine and arranged as a standing wave resonator. The system also includes at least one impedance line interconnecting the at least one resonator spine and a low-voltage rail. The at least one impedance line can correspond to the respective at least one resonator rib. The system further includes at least one coupling capacitor. Each of the at least one coupling capacitor can interconnect at least one of the at least one resonator rib and a respective circuit to capacitively provide a clock current corresponding to the sinusoidal clock signal to the respective circuit to provide functions for the respective circuit.

Another embodiment includes a clock distribution system. The system includes a plurality of resonator spines that each propagate one of a respective plurality of sinusoidal clock signals. Each of the plurality of sinusoidal clock signals can have a respective one of a plurality of distinct phases. The system also includes at least one resonator rib conductively coupled to each of the plurality of resonator spines. Each of the at least one resonator rib can be arranged as a standing wave resonator. The system further includes a coupling capacitor coupled to each of the at least one resonator rib of each of the plurality of spines. A first coupling capacitor associated with a first one of the plurality of spines and a second coupling capacitor associated with a second one of the plurality of spines can be coupled to a circuit to capacitively provide a clock current having a phase that is not equal to and resides between two of the plurality of distinct phases to provide functions for the respective circuit.

DETAILED DESCRIPTION

The present invention relates generally to computer systems, and specifically to a capacitive clock distribution system. The clock distribution system, as described herein, is arranged as a resonator "spine" and "rib" configuration. As described herein, the term "spine", as pertaining to the resonator, describes a conductor that is configured to propagate a sinusoidal clock signal (e.g., an in-phase or quadrature-phase clock signal). The term "rib", as pertaining to the resonator, describes a conductor that is conductively coupled to the spine and is arranged as a standing-wave resonator that propagates the sinusoidal clock signal. The clock distribution system can include a plurality of resonator ribs that are each conductively coupled to the same resonator spine, and thus can each separately propagate the sinusoidal clock signal from the resonator spine.

The clock distribution system also includes at least one coupling capacitor that distributes the sinusoidal clock signal to a circuit. As an example, the coupling capacitor(s) each interconnect at least one resonator rib and a respective circuit to capacitively provide a clock current corresponding to the sinusoidal clock signal to the respective circuit to provide functions for the respective circuit. The functions can correspond, for example, to timing functions, data capture, biasing of one or more Josephson junctions, or a variety of other circuit functions. As an example, the clock distribution system can further include at least one impedance line, such as corresponding to each of the resonator rib(s), to provide resonance with respect to the sinusoidal clock signal.

Figure 1:
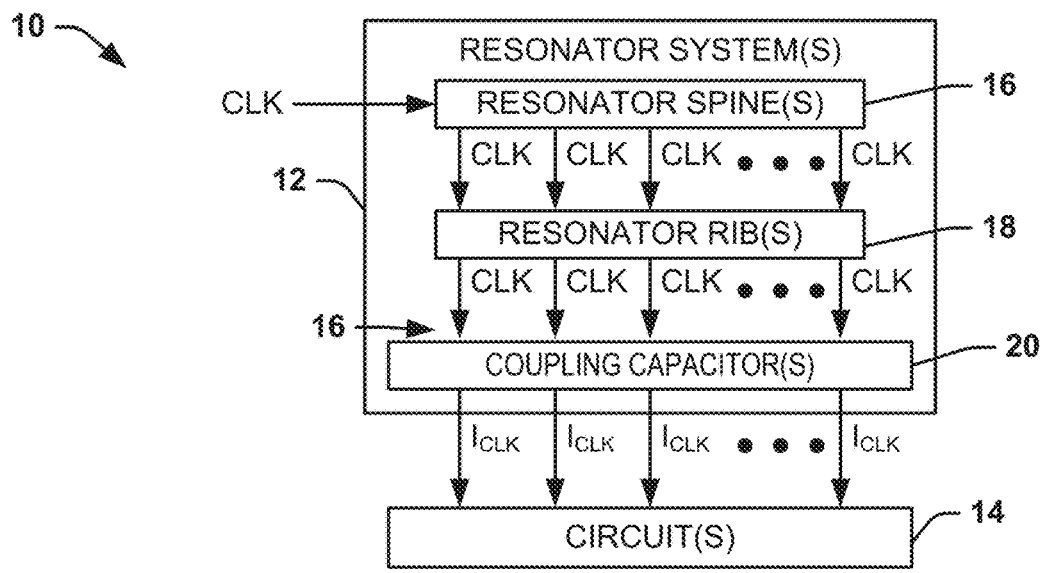
FIG. 1 illustrates an example diagram of a clock distribution system.

FIG. 1 illustrates an example of a clock distribution system 10. The clock distribution system 10 can be implemented in a variety of applications, such as in a reciprocal quantum logic (RQL) circuit design. For example, the clock distribution system 10 can be implemented in or as part of an integrated circuit (IC) chip.

The clock distribution system 10 includes at least one resonator system 12. The resonator system(s) 12 can be configured to provide a clock signal CLK to each of a respective one or more circuits 14 that may be distributed across an IC chip in which the clock distribution system 10 is implemented, as described herein. In the example of FIG. 1, each of the resonator system(s) 12 includes at least one resonator spine 16 and at least one resonator rib 18. The resonator rib(s) 18 are each conductively coupled to a given one of the resonator spine(s) 16. Thus, the clock signal CLK, provided to the resonator spine(s) 16 (e.g., from a local oscillator), can be provided to propagate on each of the respective resonator rib(s) 18.

In the example of FIG. 1, the resonator system 12 also includes at least one coupling capacitor 20. Each of the coupling capacitor(s) 20 can be conductively coupled to one or more of the resonator rib(s) 18 to capacitively provide a clock current $I_{CLK}$ to an associated one of the circuit(s) 14. Particularly, the coupling capacitor(s) 20 can act as high-pass filters to provide the clock signal CLK from the respective resonator rib(s) 18 to generate the clock current $I_{CLK}$ corresponding to the clock signal CLK to provide functions (e.g., timing functions and/or power distribution functions) for the associated circuit(s) 14. As described herein, there can be a multitude of different configurations of the resonator rib(s) 18 and spine(s) 16, and thus a multitude of different ways to provide the capacitive coupling of the circuit(s) 14 to the resonator rib(s) 18.

Figure 2:
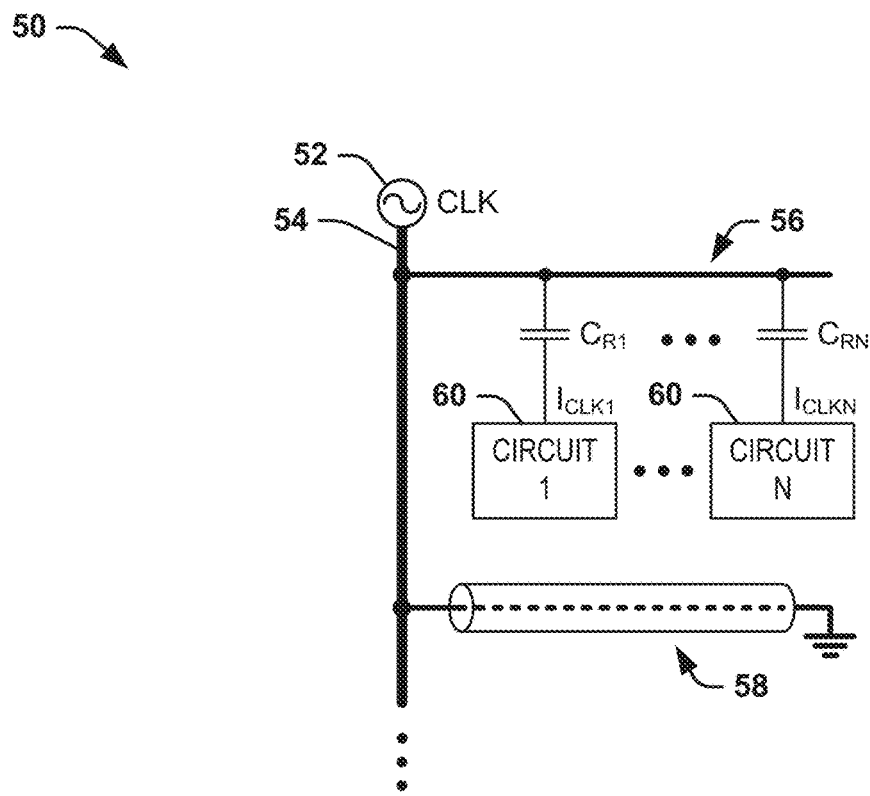
FIG. 2 illustrates an example of a clock distribution system.

FIG. 2 illustrates an example of a resonator system 50. The resonator system 50 can correspond to one of the resonator system(s) 12 in the example of FIG. 1. Therefore, reference is to be made to the example of FIG. 1 in the following description of the example of FIG. 2.

The resonator system 50 includes a signal source 52 that is configured to provide the clock signal CLK. The signal source 52 is connected to a resonator spine 54 that is arranged as a conductor to propagate the clock signal CLK. As an example, the clock signal CLK can correspond to an in-phase clock signal, a quadrature-phase clock signal, an opposite in-phase clock signal (e.g., 180° out-of-phase of the in-phase clock signal), or an opposite quadrature-phase clock signal (e.g., 180° out-of-phase of the quadrature-phase clock signal). In the example of FIG. 2, the resonator system 50 includes a resonator rib 56 that is conductively coupled to the resonator spine 54 to likewise propagate the clock signal CLK. In the example of FIG. 2, the resonator rib 56 is demonstrated as open-ended at the end opposite the resonator spine 54, and is therefore unterminated. The resonator system 50 also includes an impedance line 58 that is connected to the resonator spine 54 and which is terminated at a low-voltage rail, demonstrated in the example of FIG. 2 as ground. The impedance line 58 is demonstrated as a transmission line having a predetermined impedance, and can correspond to the resonator rib 56.

For example, the resonator rib 56 and the impedance line 58 can collectively be configured as a standing-wave resonator, such that the resonator rib 56 and the impedance line 58 can have a combined physical length that is approximately equal to a predetermined length associated with a wavelength of the clock signal CLK. For example, the resonator rib 56 and the impedance line 58 can have a total combined length that is approximately equal to one-quarter of the wavelength $\lambda$ of the clock signal CLK (i.e., $\lambda/4$). Therefore, based on the standing-wave resonator configuration of the resonator rib 56 and the impedance line 58, the clock signal CLK can have a magnitude that is greatest at the open end.

In the example of FIG. 2, a plurality N of circuits 60 are each demonstrated as coupled to the resonator rib 56 via a respective one of a plurality of coupling capacitors, demonstrated as $C_{R1}$ through $C_{RN}$. Therefore, the coupling capacitors $C_{R1}$ through $C_{RN}$ operate as high-pass filters to provide the clock signal CLK as respective clock currents $I_{CLK1}$ through $I_{CLKN}$ that are provided to the respective circuits 60. As an example, the length of the resonator rib 54 can be designed to be short (e.g., relative to the impedance line 58) to provide that the amplitude of each of the clock currents $I_{CLK1}$ through $I_{CLKN}$ is approximately uniform (e.g., equal) with respect to the circuits 60.

As an example, the resonator system 50 can include a plurality of resonator ribs 54, with a respective plurality of impedance lines 58. Therefore, multiple sets of circuits 60 can be provided the clock current $I_{CLK}$ corresponding to the clock signal CLK, with each set corresponding to a given one of the resonator rib 54/impedance line 58 pair, such that the amplitudes of the clock currents $I_{CLK}$ can be approximately uniform. As another example, the resonator system 50 can be one of a plurality of resonator systems that can each correspond to a different clock signal CLK. For example, the different clock signals CLK can correspond to an in-phase clock signal, a quadrature-phase clock signal, an opposite in-phase clock signal (e.g., 180° out-of-phase of the in-phase clock signal), or an opposite quadrature-phase clock signal (e.g., 180° out-of-phase of the quadrature-phase clock signal), such as for a Reciprocal Quantum Logic (RQL) circuit system. As described in greater detail herein, a resonator system can include a given phase clock signal CLK and an opposite phase clock signal CLK.

Figure 3:
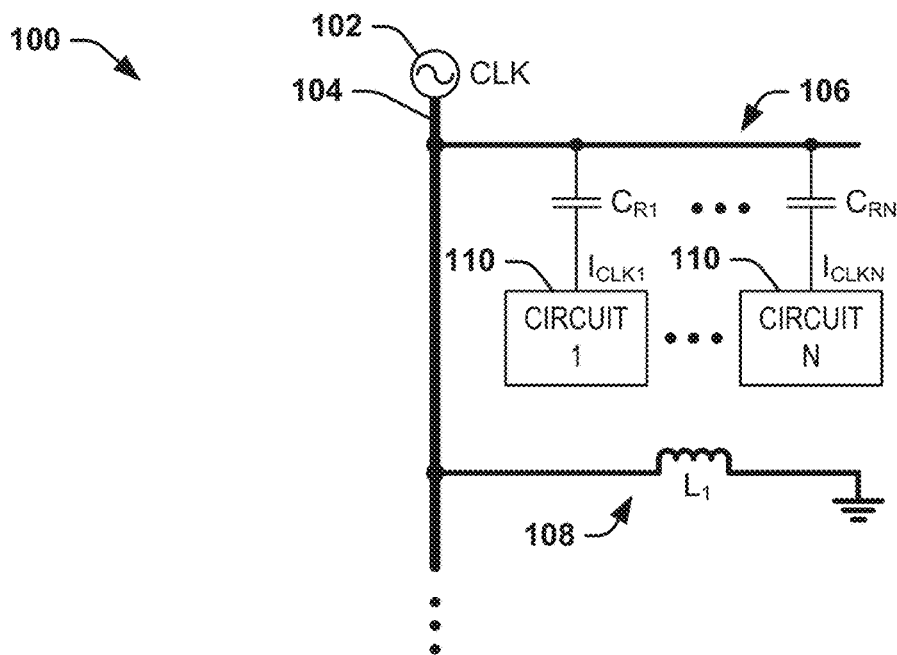
FIG. 3 illustrates another example of a clock distribution system.

FIG. 3 illustrates an example of a resonator system 100. The resonator system 100 can correspond to one of the resonator system(s) 12 in the example of FIG. 1. Therefore, reference is to be made to the example of FIG. 1 in the following description of the example of FIG. 3.

The resonator system 100 includes a signal source 102 that is configured to provide the clock signal CLK. The signal source 102 is connected to a resonator spine 104 that is arranged as a conductor to propagate the clock signal CLK. As an example, the clock signal CLK can correspond to an in-phase clock signal, a quadrature-phase clock signal, an opposite in-phase clock signal (e.g., 180° out-of-phase of the in-phase clock signal), or an opposite quadrature-phase clock signal (e.g., 180° out-of-phase of the quadrature-phase clock signal). In the example of FIG. 3, the resonator system 100 includes a resonator rib 106 that is conductively coupled to the resonator spine 104 to likewise propagate the clock signal CLK. In the example of FIG. 3, the resonator rib 106 is demonstrated as open-ended at the end opposite the resonator spine 104, and is therefore unterminated.

The resonator system 100 also includes an impedance line 108 that is connected to the resonator spine 104 and which is terminated at a low-voltage rail, demonstrated in the example of FIG. 3 as ground. The impedance line 108 is demonstrated in the example of FIG. 3 as an inductor $L_1$ having a predetermined impedance, and can correspond to the resonator rib 106. For example, the resonator rib 106 and the impedance line 108 can collectively be configured as a standing-wave LC resonator having a resonant frequency that is approximately equal to the frequency of the clock signal CLK. Therefore, based on the standing-wave resonator configuration of the resonator rib 106 and the impedance line 108, the clock signal CLK can have a magnitude that is greatest at the open end.

In the example of FIG. 3, a plurality N of circuits 60 are each demonstrated as coupled to the resonator rib 106 via a respective one of a plurality of coupling capacitors, demonstrated as $C_{R1}$ through $C_{RN}$. Therefore, the coupling capacitors $C_{R1}$ through $C_{RN}$ operate as high-pass filters to provide the clock signal CLK as respective clock currents $I_{CLK1}$ through $I_{CLKN}$ that are provided to the respective circuits 60. As an example, the length of the resonator rib 104 can be designed to be short (e.g., relative to the impedance line 108) to provide that the amplitude of each of the clock currents $I_{CLK1}$ through $I_{CLKN}$ is approximately uniform (e.g., equal) with respect to the circuits 60.

Therefore, the resonator system 100 demonstrates an alternative arrangement to the resonator system 50 in the example of FIG. 2. As an example, the resonator system 100 can include a plurality of resonator ribs 104, with a respective plurality of impedance lines 108. Therefore, multiple sets of circuits 60 can be provided the clock current $I_{CLK}$ corresponding to the clock signal CLK, with each set corresponding to a given one of the resonator rib 104/impedance line 108 pair, such that the amplitudes of the clock currents $I_{CLK}$ can be approximately uniform. As another example, the resonator system 100 can be one of a plurality of resonator systems that can each correspond to a different clock signal CLK. For example, the different clock signals CLK can correspond to an in-phase clock signal, a quadrature-phase clock signal, an opposite in-phase clock signal (e.g., 180° out-of-phase of the in-phase clock signal), or an opposite quadrature-phase clock signal (e.g., 180° out-of-phase of the quadrature-phase clock signal), such as for a Reciprocal Quantum Logic (RQL) circuit system.

Figure 4:
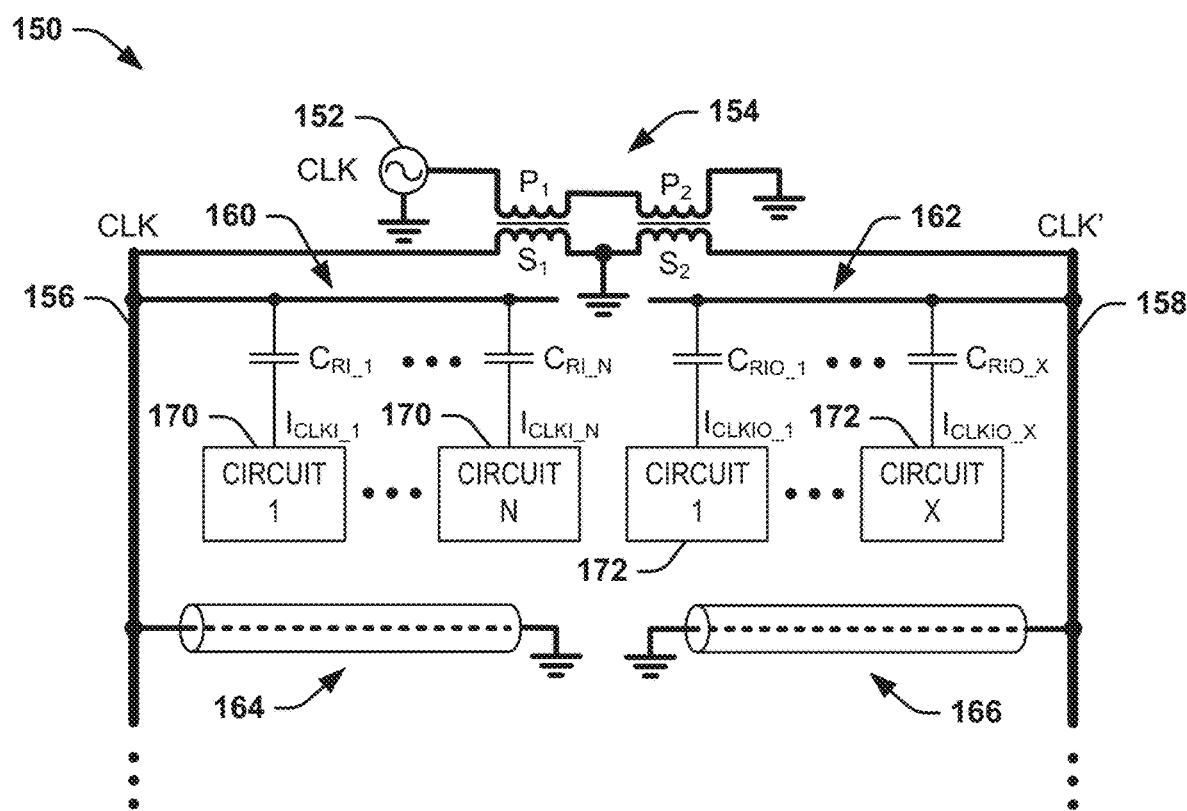
FIG. 4 illustrates yet another example of a clock distribution system.

FIG. 4 illustrates an example of a resonator system 150. The resonator system 150 can correspond to one of the resonator system(s) 12 in the example of FIG. 1. Therefore, reference is to be made to the example of FIG. 1 in the following description of the example of FIG. 4.

The resonator system 150 includes a signal source 152 that is configured to provide the clock signal CLK. The signal source 152 is connected to a first inductor $P_1$ and a second inductor $P_2$ that correspond to primary windings of a differential transformer, demonstrated generally at 154, that is also coupled to the low-voltage rail (e.g., ground). The differential transformer 154 also includes an inductor $S_1$ and an inductor $S_2$ corresponding to secondary windings that are separated by the low-voltage rail (e.g., ground). As an example, the low-voltage rail between the inductors $S_1$ and $S_2$ can correspond to a virtual ground, and can thus be omitted from the resonator system 150. The secondary windings S1 and S2 are also each coupled to a first resonator spine 156 and a second resonator spine 158. Therefore, based on the arrangement of the differential transformer 154 and the resonator spines 156 and 158, the first resonator spine 156 is arranged as a conductor to propagate the clock signal CLK and the second resonator spine 158 is arranged as a conductor to propagate an opposite phase clock signal CLK' having a phase that is 180° the phase of the clock signal CLK.

In the example of FIG. 4, the resonator system 150 includes a first resonator rib 160 that is conductively coupled to the first resonator spine 156 to likewise propagate the clock signal CLK, and includes a second resonator rib 162 that is conductively coupled to the second resonator spine 156 to likewise propagate the clock signal CLK'. In the example of FIG. 4, the resonator ribs 160 and 162 are demonstrated as open-ended at the ends opposite the respective resonator spines 154 and 156, and are therefore unterminated. The resonator system 150 also includes a first impedance line 164 that is connected to the first resonator spine 156 and which is terminated at the low-voltage rail, and a second impedance line 166 that is connected to the second resonator spine 158 and which is terminated at the low-voltage rail. The impedance lines 164 and 166 are demonstrated as transmission lines each having a predetermined impedance (e.g., approximately equal with respect to each other), and can correspond to the respective resonator ribs 160 and 162.

Similar to as described previously, the resonator ribs 160 and 162 and the respective impedance lines 164 and 166 can collectively be configured as standing-wave resonators. For example, each of the pairs of resonator rib and impedance line can have a total combined length associated with the wavelength of the clock signal CLK. As an example, the first resonator rib 160 and the first impedance line 164, as well as the second resonator rib 162 and the second impedance line 166, can have a total combined length that is approximately equal to one-quarter of the wavelength λ of the clock signal CLK (i.e., λ/4). Therefore, based on the standing-wave resonator configuration of the first resonator rib 160 and the first impedance line 164, the clock signal CLK can have a magnitude that is greatest at the open end. Similarly, based on the standing-wave resonator configuration of the second resonator rib 162 and the second impedance line 166, the clock signal CLK' can have a magnitude that is greatest at the open end. While the example of FIG. 4 demonstrates the use of transmission line segments similar to as described in the example of FIG. 2, it is to be understood that one or both of the impedance lines 164 and 166 can instead be implemented as inductors, similar to as described in the example of FIG. 3.

In the example of FIG. 4, a plurality N of circuits 170 are each demonstrated as coupled to the resonator rib 160 via a respective one of a plurality of coupling capacitors, demonstrated as $C_{RI\_1}$ through $C_{RI\_N}$. Similarly, a plurality X of circuits 172 are each demonstrated as coupled to the resonator rib 162 via a respective one of a plurality of coupling capacitors, demonstrated as $C_{RIO\_1}$ through $C_{RIO\_X}$. Therefore, the coupling capacitors $C_{RI\_1}$ through $C_{RI\_N}$ operate as high-pass filters to provide the clock signal CLK as respective clock currents $I_{CLKI\_1}$ through $I_{CLKI\_N}$ that are provided to the respective circuits 170. Similarly, the coupling capacitors $C_{RIO\_1}$ through $C_{RIO\_X}$ operate as high-pass filters to provide the clock signal CLK as respective clock currents $I_{CLKIO\_1}$ through $I_{CLKIO\_X}$ that are provided to the respective circuits 172. Therefore, the resonator system 150 is demonstrated as being arranged to provide opposite phase clock signals CLK and CLK' to separate sets of circuits 170 and 172, respectively, in a manner similar to the resonator systems 50 and 100 in the respective examples of FIGS. 2 and 3.

Figure 5:
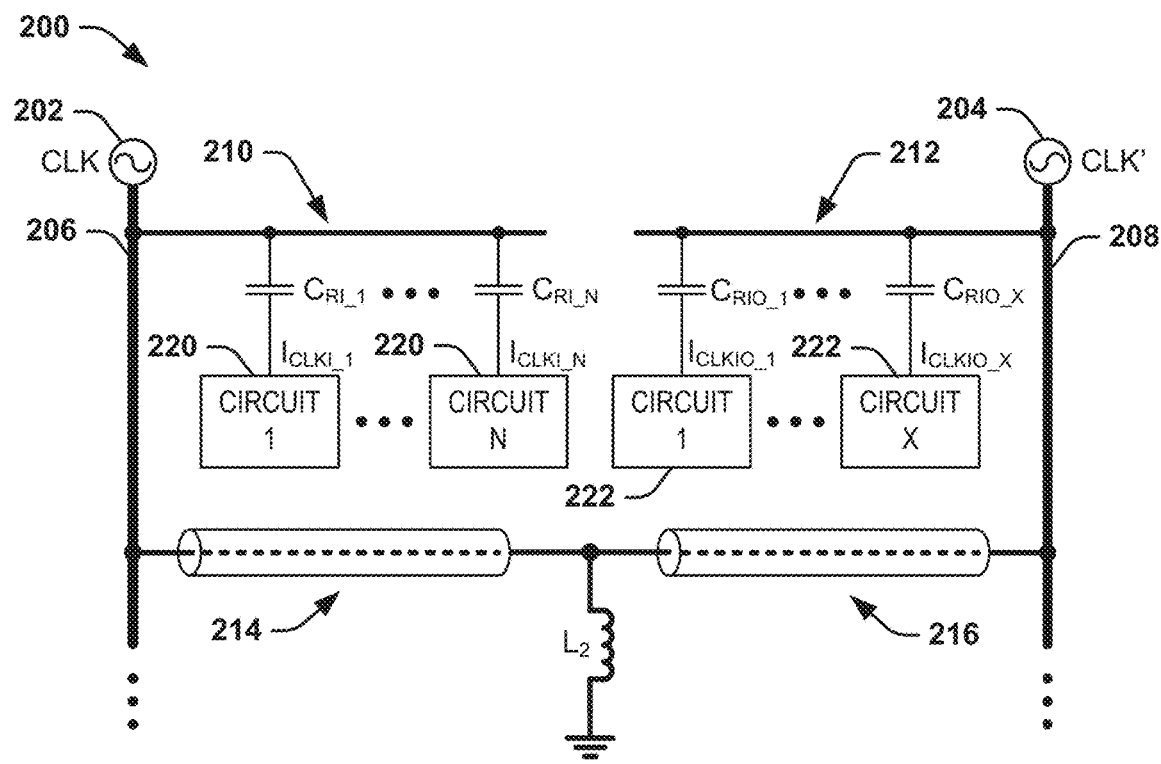
FIG. 5 illustrates yet another example of a clock distribution system.

FIG. 5 illustrates an example of a resonator system 200. The resonator system 200 can correspond to one of the resonator system(s) 12 in the example of FIG. 1. Therefore, reference is to be made to the example of FIG. 1 in the following description of the example of FIG. 5.

The resonator system 200 includes a first signal source 202 that is configured to provide the clock signal CLK and a second signal source 204 that is configured to provide the opposite phase clock signal CLK'. The first signal source 202 is connected to a first resonator spine 206 and the second signal source 204 is connected to a second resonator spine 208. In the example of FIG. 5, the resonator system 200 includes a first resonator rib 210 that is conductively coupled to the first resonator spine 206 to likewise propagate the clock signal CLK, and includes a second resonator rib 212 that is conductively coupled to the second resonator spine 206 to likewise propagate the clock signal CLK'. In the example of FIG. 5, the resonator ribs 210 and 212 are demonstrated as open-ended at the ends opposite the respective resonator spines 204 and 206, and are therefore unterminated. The resonator system 200 also includes a first impedance line 214 that is connected to the first resonator spine 206 and a second impedance line 216 that is connected to the second resonator spine 208. The impedance lines 214 and 216 are each also coupled at ends opposite the respective resonator spines 206 and 208 to an inductor L2 that interconnects the impedance lines 214 and 216 and the low-voltage rail. The impedance lines 214 and 216 are demonstrated as transmission lines each having a predetermined impedance (e.g., approximately equal with respect to each other), and can correspond to the respective resonator ribs 210 and 212. Additionally, the common low-voltage rail of the clock signals CLK and CLK' via the inductor L2 provides for a differential operation of the resonator system 200.

Similar to as described previously, the resonator ribs 210 and 212 and the respective impedance lines 214 and 216 can collectively be configured as standing-wave resonators. For example, each of the pairs of resonator rib and impedance line can have a total combined length associated with the wavelength of the clock signal CLK. As an example, the first resonator rib 210 and the first impedance line 214, as well as the second resonator rib 212 and the second impedance line 216, can have a total combined length that is approximately equal to one-quarter of the wavelength λ of the clock signal CLK (i.e., λ/4). Therefore, based on the standing-wave resonator configuration of the first resonator rib 210 and the first impedance line 214, the clock signal CLK can have a magnitude that is greatest at the open end. Similarly, based on the standing-wave resonator configuration of the second resonator rib 212 and the second impedance line 216, the clock signal CLK' can have a magnitude that is greatest at the open end. While the example of FIG. 5 demonstrates the use of transmission line segments similar to as described in the example of FIG. 2, it is to be understood that one or both of the impedance lines 214 and 216 can instead be implemented as inductors, similar to as described in the example of FIG. 3, with the inductors being coupled to the inductor L2.

In the example of FIG. 5, a plurality N of circuits 220 are each demonstrated as coupled to the resonator rib 210 via a respective one of a plurality of coupling capacitors, demonstrated as $C_{RI\_1}$ through $C_{RI\_N}$. Similarly, a plurality X of circuits 222 are each demonstrated as coupled to the resonator rib 212 via a respective one of a plurality of coupling capacitors, demonstrated as $C_{RIO\_1}$ through $C_{RIO\_X}$. Therefore, the coupling capacitors $C_{RI\_1}$ through $C_{RI\_N}$ operate as high-pass filters to provide the clock signal CLK as respective clock currents $I_{CLKI\_1}$ through $I_{CLKI\_N}$ that are provided to the respective circuits 220. Similarly, the coupling capacitors $C_{RIO\_1}$ through $C_{RIO\_X}$ operate as high-pass filters to provide the clock signal CLK as respective clock currents $I_{CLKIO\_1}$ through $I_{CLKIO\_X}$ that are provided to the respective circuits 222. Therefore, the resonator system 200 is demonstrated as being arranged to provide opposite phase clock signals CLK and CLK' to separate sets of circuits 220 and 222, respectively, in a manner similar to the resonator systems 50 and 100 in the respective examples of FIGS. 2 and 3.

Figure 6:
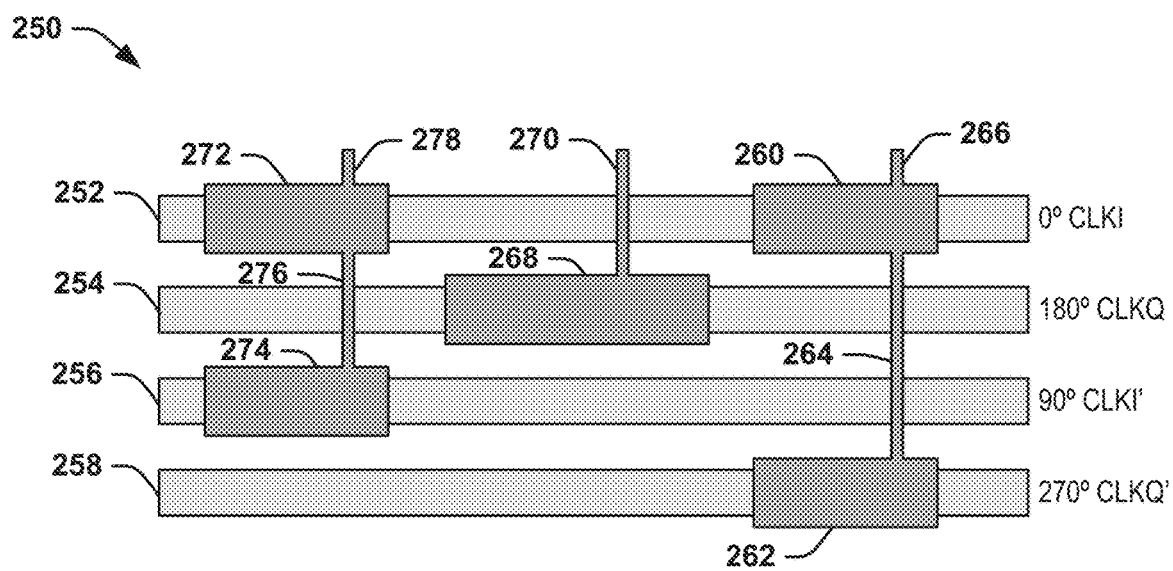
FIG. 6 illustrates another example diagram of a clock distribution system.

FIG. 6 illustrates another example diagram 250 of a clock distribution system. The diagram 250 demonstrates a first resonator rib 252, a second resonator rib 254, a third resonator rib 256, and a fourth resonator rib 258. Each of the resonator ribs 252, 254, 256, and 258 can correspond to different phases of the clock signal CLK. In the example of FIG. 6, the first resonator rib 252 is associated with a first phase, demonstrated as 0°, the second resonator rib 254 is associated with a second phase, demonstrated as 180°, the third resonator rib 256 is associated with a third phase, demonstrated as 90°, and the fourth resonator rib 258 is associated with a fourth phase, demonstrated as 270°. In the example of FIG. 6, the first and second resonator ribs 252 and 254 can correspond to respective opposite phase clock signals $CLK_I$ and $CLK_I'$ corresponding to an in-phase clock signal, and the third and fourth resonator ribs 256 and 258 can correspond to respective opposite phase clock signals $CLK_Q$ and $CLK_Q'$ corresponding to a quadrature-phase clock signal.

For example, the first and second resonator ribs 252 and 254 can be generated from a pair of resonator systems, such as the resonator systems 50 and 100 in the respective examples of FIGS. 2 and 3, based on different signal generators that are opposite phase with respect to each other. Alternatively, the first and second resonator ribs 252 and 254 can be generated from an opposite phase resonator system, such as one of the resonator systems 150 and 200 in the respective examples of FIGS. 4 and 5. Similarly, the third and fourth resonator ribs 256 and 258 can be generated from a pair of resonator systems, such as the resonator systems 50 and 100 in the respective examples of FIGS. 2 and 3, based on different signal generators that are opposite phase with respect to each other. Alternatively, the third and fourth resonator ribs 256 and 258 can be generated from an opposite phase resonator system, such as one of the resonator systems 150 and 200 in the respective examples of FIGS. 4 and 5.

In the example of FIG. 6, a number of conductors are arranged proximal with the resonator ribs 252, 254, 256, and 258 to form capacitors (e.g., the capacitors $C_{R1}$ through $C_{RN}$) that are coupled to circuits (not shown) via a conductor. As demonstrated in the example of FIG. 6, multiple capacitors can be coupled to multiple different resonator ribs to provide a clock current that is off-phase with respect to the phase of the clock signals $CLK_I$, $CLK_I'$, $CLK_Q$, and $CLK_Q'$ provided by the individual resonator ribs 252, 254, 256, and 258, respectively.

As a first example, a first conductor 260 is arranged proximal to the first resonator rib 252 and a second conductor 262 is arranged proximal to the fourth resonator rib 258. Therefore, the first conductor 260 and the first resonator rib 252 form a first capacitor, and the second conductor 262 and the fourth resonator rib 258 form a second capacitor. The first and second capacitors are conductively connected via a conductor 264, and a conductor 266 can be connected to an associated circuit (not shown). In the example of FIG. 6, the first and second conductors 260 and 262 are approximately equal in size, and thus equal with respect to surface area that is proximal to the respective resonator ribs 252 and 258. Therefore, the first and second capacitors can have capacitance values that are approximately equal to provide approximately equal contributions of the respective clock signals $CLK_I$ and $CLK_Q'$. As a result, the first and second capacitors can provide a clock current to the associated circuit that is an approximately equal contribution of the 0° and 270° phases, and can thus correspond to a 315° clock signal.

As a second example, a third conductor 268 is arranged proximal to the second resonator rib 254. Therefore, the third conductor 268 and the second resonator rib 254 form a third capacitor that is conductively connected to an associated circuit (not shown) by a conductor 270. In the example of FIG. 6, the third conductor 268 is approximately greater in size than the first and second conductors 260 and 262 (e.g., by a principal square-root of two multiplicative factor). Therefore, the third capacitor can have an approximately equal capacitance value as the capacitance value of the first and second capacitors combined. As a result, the third capacitor can provide a clock current to the associated circuit that is an approximately equal contribution of the 180° phase $CLK_I'$.

As a third example, a fourth conductor 272 is arranged proximal to the first resonator rib 252 and a fifth conductor 274 is arranged proximal to the third resonator rib 256. Therefore, the fourth conductor 272 and the first resonator rib 252 form a fourth capacitor, and the fifth conductor 274 and the third resonator rib 256 form a fifth capacitor. The fourth and fifth capacitors are conductively connected via a conductor 276, and a conductor 278 can be connected to an associated circuit (not shown). In the example of FIG. 6, the fourth and fifth conductors 268 and 270 are approximately equal in size, and thus equal with respect to surface area that is proximal to the respective resonator ribs 252 and 256, as well as approximately equal to the first and second conductors 260 and 262. Therefore, the fourth and fifth capacitors can have capacitance values that are approximately equal to provide approximately equal contributions of the respective clock signals $CLK_I$ and $CLK_Q$. As a result, the first and second capacitors can provide a clock current to the associated circuit that is an approximately equal contribution of the 0° and 90° phases, and can thus correspond to a 45° clock signal.

Accordingly, the diagram 250 demonstrates examples of providing clock phases that are out-of-phase with respect to the phases of the clock signals $CLK_I$, $CLK_I'$, $CLK_Q$, and $CLK_Q'$. The examples provided in the example of FIG. 6 are not exhaustive, such that additional examples of different phases can be provided based on different combinations of conductors with the respective resonator ribs 252, 254, 256, and 258, as well as different sizes of the conductors to provide varying capacitive values. Accordingly, the capacitors can be provided in a variety of different ways to provide clock currents to the associated circuits.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A clock distribution system comprising:
   a plurality of resonator spines that each propagate a respective sinusoidal clock signal, the sinusoidal clock signal associated with each of the resonator spines having a distinct phase relative to each other;
   at least one resonator rib conductively coupled to each of the resonator spines and arranged as a standing wave resonator; and
   at least one coupling capacitor, each of the at least one coupling capacitor interconnecting at least one of the at least one resonator rib and a respective circuit to capacitively provide a clock current corresponding to the sinusoidal clock signal to the respective circuit to provide functions for the respective circuit.

2. The system of claim 1, further comprising at least one impedance line interconnecting the resonator spines and a low-voltage rail, the at least one impedance line corresponding to the respective at least one resonator rib.

3. The system of claim 2, wherein the at least one impedance line comprises a transmission line having a predetermined impedance between the resonator spines and the low-voltage rail.

4. The system of claim 2, wherein the at least one impedance line comprises an inductor that is configured to operate as an LC-resonator having a resonant frequency that is approximately equal to a frequency of the sinusoidal clock signal.

5. The system of claim 1, wherein the resonator spines comprise:
   a first resonator spine configured to propagate a first sinusoidal clock signal having a first phase; and
   a second resonator spine configured to propagate a second sinusoidal clock signal having a second phase that is 180° relative to the first phase.

6. The system of claim 5, further comprising:
   a clock generator configured to generate the first sinusoidal clock signal; and
   a differential transformer configured to inductively provide the first sinusoidal clock signal to the first resonator spine and to inductively provide the second sinusoidal clock signal to the second resonator spine based on the clock generator.

7. The system of claim 5, further comprising:
   a first clock generator configured to generate the first sinusoidal clock signal;
   a second clock generator configured to generate the second sinusoidal clock signal;
   at least one first impedance line connected to the first resonator spine;
   at least one second impedance line connected to the second resonator spine, each of the at least one second impedance line being also coupled to a respective one of the at least one first impedance line at a differential node; and
   an inductor interconnecting the differential node and a low-voltage rail.

8. The system of claim 1, wherein the at resonator spines comprise:
   a first resonator spine configured to propagate a first sinusoidal clock signal corresponding to an in-phase clock signal; and
   a second resonator spine configured to propagate a second sinusoidal clock signal corresponding to a quadrature-phase clock signal.

9. The system of claim 8, wherein the resonator spines comprise:
   a third resonator spine configured to propagate a third sinusoidal clock signal corresponding to an opposite in-phase clock signal; and
   a fourth resonator spine configured to propagate a fourth sinusoidal clock signal corresponding to an opposite quadrature-phase clock signal.

10. The system of claim 9, wherein the at least one coupling capacitor comprises a plurality of coupling capacitors configured to interconnect the circuit to a plurality of resonator ribs associated with a respective plural combination of the first, second, third, and fourth resonator spines to capacitively provide the clock current having a phase not equal to and residing between two of the in-phase clock signal, the opposite in-phase clock signal, the quadrature-phase clock signal, and the opposite quadrature-phase clock signal to the respective circuit to provide functions for the respective circuit.

11. A clock distribution system comprising:
at least one resonator spine that propagates a sinusoidal clock signal;
at least one resonator rib conductively coupled to the at least one resonator spine and arranged as a standing wave resonator;
at least one impedance line interconnecting the at least one resonator spine and a low-voltage rail, the at least one impedance line corresponding to the respective at least one resonator rib;
at least one coupling capacitor, each of the at least one coupling capacitor interconnecting at least one of the at least one resonator rib and a respective circuit to capacitively provide a clock current corresponding to the sinusoidal clock signal to the respective circuit to provide functions for the respective circuit.

12. The system of claim 11, wherein the at least one impedance line comprises a transmission line having a predetermined impedance between the at least one resonator spine and the low-voltage rail.

13. The system of claim 11, wherein the at least one impedance line comprises an inductor that is configured to operate as an LC-resonator having a resonant frequency that is approximately equal to a frequency of the sinusoidal clock signal.

14. The system of claim 11, wherein the at least one resonator spine comprises:
a first resonator spine configured to propagate a first sinusoidal clock signal corresponding to an in-phase clock signal;
a second resonator spine configured to propagate a second sinusoidal clock signal corresponding to a quadrature-phase clock signal;
a third resonator spine configured to propagate a third sinusoidal clock signal corresponding to an opposite in-phase clock signal; and
a fourth resonator spine configured to propagate a fourth sinusoidal clock signal corresponding to an opposite quadrature-phase clock signal.

15. The system of claim 14, wherein the at least one coupling capacitor comprises a plurality of coupling capacitors configured to interconnect the circuit to a plurality of resonator ribs associated with a respective plural combination of the first, second, third, and fourth resonator spines to capacitively provide the clock current having a phase not equal to and residing between two of the in-phase clock signal, the opposite in-phase clock signal, the quadrature-phase clock signal, and the opposite quadrature-phase clock signal to the respective circuit to provide functions for the respective circuit.

16. A clock distribution system comprising:
a plurality of resonator spines that each propagate one of a respective plurality of sinusoidal clock signals, each of the plurality of sinusoidal clock signals having a respective one of a plurality of distinct phases;
at least one resonator rib conductively coupled to each of the plurality of resonator spines, each of the at least one resonator rib being arranged as a standing wave resonator; and
a coupling capacitor coupled to each of the at least one resonator rib of each of the plurality of spines, a first coupling capacitor associated with a first one of the plurality of resonator spines and a second coupling capacitor associated with a second one of the plurality of resonator spines being coupled to a circuit to capacitively provide a clock current having a phase that is not equal to and resides between two of the plurality of distinct phases associated with the first one of the plurality of resonator spines and the second one of the plurality of resonator spines to provide functions for the respective circuit.

17. The system of claim 16, further comprising at least one impedance line interconnecting each of the plurality of resonator spines and a low-voltage rail, each of the at least one impedance line corresponding to the respective at least one resonator rib associated with each of the plurality resonator spines.

18. The system of claim 17, wherein each of the at least one impedance line comprises a transmission line having a predetermined impedance between the at least-one resonator spine and the low-voltage rail.

19. The system of claim 17, wherein the at least one impedance line comprises an inductor that is configured to operate as an LC-resonator having a resonant frequency that is approximately equal to a frequency of the sinusoidal clock signal.

20. The system of claim 16, wherein the plurality of resonator spines comprises:
a first resonator spine configured to propagate a first sinusoidal clock signal corresponding to an in-phase clock signal;
a second resonator spine configured to propagate a second sinusoidal clock signal corresponding to a quadrature-phase clock signal;
a third resonator spine configured to propagate a third sinusoidal clock signal corresponding to an opposite in-phase clock signal; and
a fourth resonator spine configured to propagate a fourth sinusoidal clock signal corresponding to an opposite quadrature-phase clock signal.

* * * * *